(12) United States Patent
Ito

(10) Patent No.: US 10,285,284 B2
(45) Date of Patent: May 7, 2019

(54) METHOD FOR MOLDING OUTER CASE OF ELECTRONIC-CIRCUIT UNIT

(71) Applicant: YAZAKI CORPORATION, Tokyo (JP)

(72) Inventor: Ken Ito, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 277 days.

(21) Appl. No.: 15/163,994

(22) Filed: May 25, 2016

(65) Prior Publication Data

US 2016/0302313 A1 Oct. 13, 2016

Related U.S. Application Data

(63) Continuation of application No. PCT/JP2014/082937, filed on Dec. 12, 2014.

(30) Foreign Application Priority Data

Dec. 26, 2013 (JP) .................................. 2013-269826

(51) Int. Cl.
| | |
|---|---|
| *B29C 45/14* | (2006.01) |
| *H05K 5/00* | (2006.01) |
| *B29C 45/00* | (2006.01) |
| *H05K 5/02* | (2006.01) |
| *H05K 5/03* | (2006.01) |

(Continued)

(52) U.S. Cl.
CPC ....... *H05K 5/0034* (2013.01); *B29C 45/0081* (2013.01); *B29C 45/14* (2013.01); *B29C 45/14336* (2013.01); *H05K 5/0226* (2013.01); *H05K 5/0247* (2013.01); *H05K 5/03* (2013.01); *B29K 2067/006* (2013.01); *B29L 2031/3481* (2013.01)

(58) Field of Classification Search
None
See application file for complete search history.

(56) References Cited

U.S. PATENT DOCUMENTS 4,890,152 A * 12/1989 Hirata ..................... H01L 21/56
174/527
5,091,341 A * 2/1992 Asada ..................... H01L 21/56
257/675
(Continued)

FOREIGN PATENT DOCUMENTS

| CN | 1116155 A | 2/1996 |
|---|---|---|
| CN | 1122276 A | 5/1996 |

(Continued)

OTHER PUBLICATIONS

International Search Report and Written Opinion of the International Search Report for PCT/JP2014/082937 dated Mar. 17, 2015.

(Continued)

*Primary Examiner* — Edmund H Lee
(74) *Attorney, Agent, or Firm* — Kenealy Vaidya LLP

(57) ABSTRACT

An outer case in an electronic circuit unit is injection molded by setting the circuit board in a die and injection molding of the outer case by filling molten resin into a cavity in the die, in pressing at least a part of a front surface side of the mold exclusion part facing a non-cavity space by press member toward a rear surface side.

5 Claims, 6 Drawing Sheets

(51) Int. Cl.
 *B29K 67/00* (2006.01)
 *B29L 31/34* (2006.01)

(56) References Cited

U.S. PATENT DOCUMENTS

| | | | |
|---|---|---|---|
| 5,420,752 A * | 5/1995 | Variot | H01L 21/565 |
| | | | 174/529 |
| 5,609,652 A | 3/1997 | Yamada et al. | |
| 5,609,889 A * | 3/1997 | Weber | B29C 45/14655 |
| | | | 249/91 |
| 5,820,244 A | 10/1998 | Yamada et al. | |
| 6,137,054 A | 10/2000 | Uezono et al. | |
| 6,811,738 B2 * | 11/2004 | Magni | H01L 21/565 |
| | | | 257/E21.504 |
| 2002/0002961 A1 | 1/2002 | Yuasa et al. | |
| 2002/0021549 A1 | 2/2002 | Kono et al. | |
| 2005/0092422 A1 | 5/2005 | Oonishi | |

FOREIGN PATENT DOCUMENTS

| | | | |
|---|---|---|---|
| CN | 1180936 A | | 5/1998 |
| CN | 1328909 A | | 1/2002 |
| CN | 1611948 A | | 5/2005 |
| JP | 01143289 | * | 6/1989 |
| JP | 01175794 | * | 7/1989 |
| JP | 2000-134766 A | | 5/2000 |
| JP | 2002-27636 A | | 1/2002 |
| JP | 2006-331779 A | | 12/2006 |
| JP | 4499612 B2 | | 7/2010 |

OTHER PUBLICATIONS

English language Written Opinion of the International Search Report for PCT/JP2014/082937 dated Mar. 17, 2015.
Chinese Office Action for the related Chinese Patent Application No. 201480064198.8 dated Mar. 30, 2017.

* cited by examiner

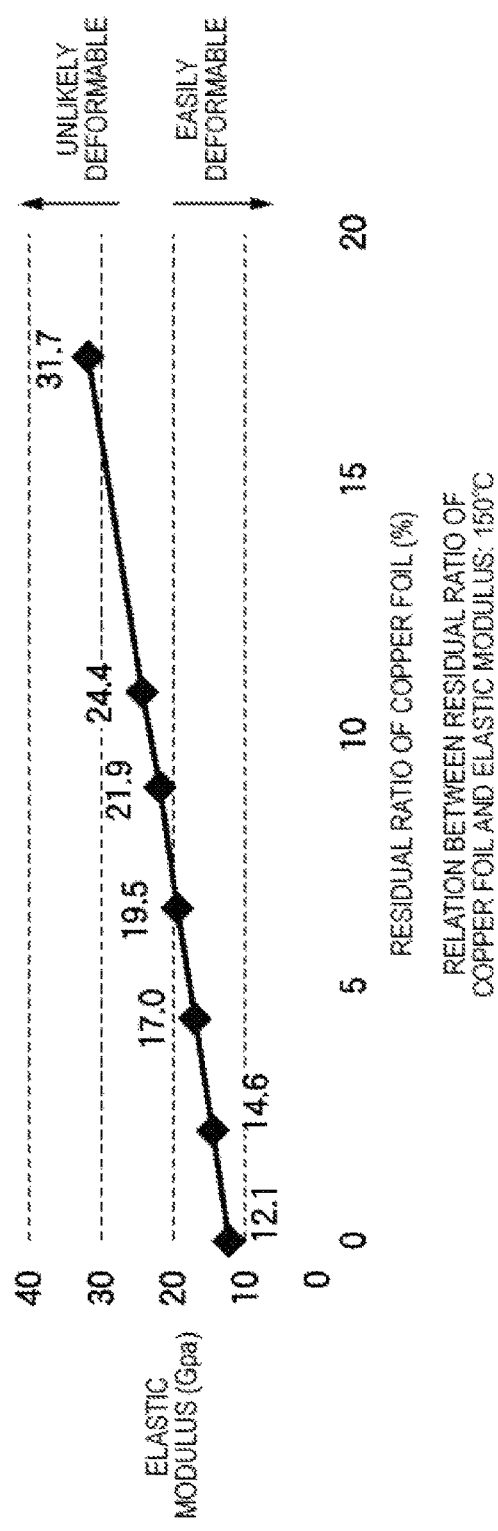

METHOD FOR MOLDING OUTER CASE OF ELECTRONIC-CIRCUIT UNIT

CROSS REFERENCE TO RELATED APPLICATIONS

This application is a continuation of PCT application No. PCT/JP2014/082937, which was filed on Dec. 12, 2014 based on Japanese Patent Application (No. 2013-269826) filed on Dec. 26, 2013, the contents of which are incorporated herein by reference.

BACKGROUND OF THE INVENTION

Field of the Invention

The present invention relates to an outer case molding method in an electronic circuit unit applied, for example, to an electronic control unit (ECU) or the like for an automobile, in particular, in the electronic circuit unit in which an outer case formed by mold resin is formed integrally with a circuit board.

Description of Related Art

In a case where a circuit board (a printed wiring board, a bus bar wiring board or the like) mounting electronic components thereon is modularized as a single electronic circuit unit equipped with a connector, etc., in general, the electronic circuit unit has been configured by incorporating the circuit board into a hard case made of resin molded separately (see a patent literature 1: JP-A-2000-134766).

However, in a case where the electronic circuit unit is configured in such the manner, the number of the components and a cost of the assembling become large.

Thus, it has been considered to set a circuit board mounting electronic components thereon within a die and form an outer case by thermoplastic resin according to insert molding. In a case of forming the outer case by the mold resin according to the insert molding in this manner, it is not necessary to separately mold a hard case by resin and incorporate the circuit board within the hard case. As a result, the number of the components can be reduced and the assembling work can be eliminated advantageously.

[Patent Literature 1] JP-A-2000-134766

According to a related art, in setting a circuit board within a die and molding a outer case, it is required not to apply a pressure against electronic components (for example, an electrolytic capacitor, an oscillator, a filter, etc.) which are intolerant of a pressure of a resin (in particular, a filling pressure of the resin into the die) upon a molding.

In terms of this, consideration is made that the electronic components intolerant of a pressure of the resin upon the molding are collectively arranged at a particular portion on the circuit board, then the circuit board is set in the die in a state of exposing the particular portion outside the die, and the outer case is formed by injection molding.

However, if the outer case is molded in this manner, the circuit board may be deformed due to a pressure of the resin acting on a rear surface side of the exposed portion upon the molding, and hence conductor wiring patterns, etc. of an inner layer of the board may be damaged.

The invention is contrived in view of the aforesaid circumstances and an object of the invention is to provide an outer case molding method in an electronic circuit unit which can suppress damage of a circuit board and electronic components caused at a time of forming the outer case by injection molding.

SUMMARY

In an aspect (1), one or more embodiments provide a molding method for an outer case in an electronic circuit unit in which a mold exclusion part, having a rear surface side covered by mold resin and a front surface side exposed from an outer case, is provided at a part of a plate surface of a circuit board which is mounted with electronic components and is covered by the outer case formed by the mold resin. According to the molding method, the outer case in the electronic circuit is molded by:

setting the circuit board in a die; and injection molding of the outer case by filling molten resin into a cavity in the die, in pressing at least a part of a front surface side of the mold exclusion part facing a non-cavity space by press member toward a rear surface side.

In an aspect (2), the injection molding may be performed in pressing a portion having a relatively low elastic modulus on the mold exclusion part in the circuit board by the press member.

In an aspect (3), the pressing member may be provided at the die.

In an aspect (4), a connector housing is integrally molded with the outer case.

In an aspect (5), a lid covering the mold exclusion part molded is integrally molded with the outer case via the hinge.

According to the aspect (1), at the time of the injection molding of the outer case, at least a part of the surface of the circuit board on the mold exclusion part is pressed by the press member toward the rear surface side. Thus, as deformation of the circuit board due to a pressure of the resin upon the injection molding can be suppressed, damage of each of the circuit board and electronic components can be suppressed.

According to the aspect (2), the press member can press a portion on the mold exclusion part having the low elastic modulus, that is, an easily deformable portion. Thus, damage of each of the circuit board and the electronic components can be suppressed efficiently.

According to the aspect (3), as the press member is provided at the die, the deformation of the circuit board upon the injection molding can be suppressed automatically by closing the die.

According to the aspect (4), as the connector housing is integrally molded with the outer case, the connector is not required to be assembled independently.

According to the aspect (5), as the lid covering the mold exclusion part is molded integrally with the outer case via the hinge, the lid can protect the mold exclusion part without increasing the number of components.

According to one or more embodiments, at the time of the injection molding of the outer case, at least a part of the surface of the circuit board on the mold exclusion part is pressed by the press member toward the rear surface side. Thus, as deformation of the circuit board due to the pressure of the resin upon the injection molding can be suppressed, damage of each of the circuit board and electronic components can be suppressed.

The invention is explained above briefly. Details of the invention will be further clarified by thoroughly reading a mode for carrying out the invention (herein after referred to as "an embodiment") explained below with reference to accompanying drawings.

BRIEF DESCRIPTION OF THE DRAWINGS

FIG. 4 is a characteristic diagram showing a relation between a residual ratio of copper foil constituting conductor wring patterns of an inner layer of the circuit board and an elastic modulus of the circuit board.

DETAILED DESCRIPTION

An Exemplary embodiment will be explained with reference to drawings.

Figure 1:
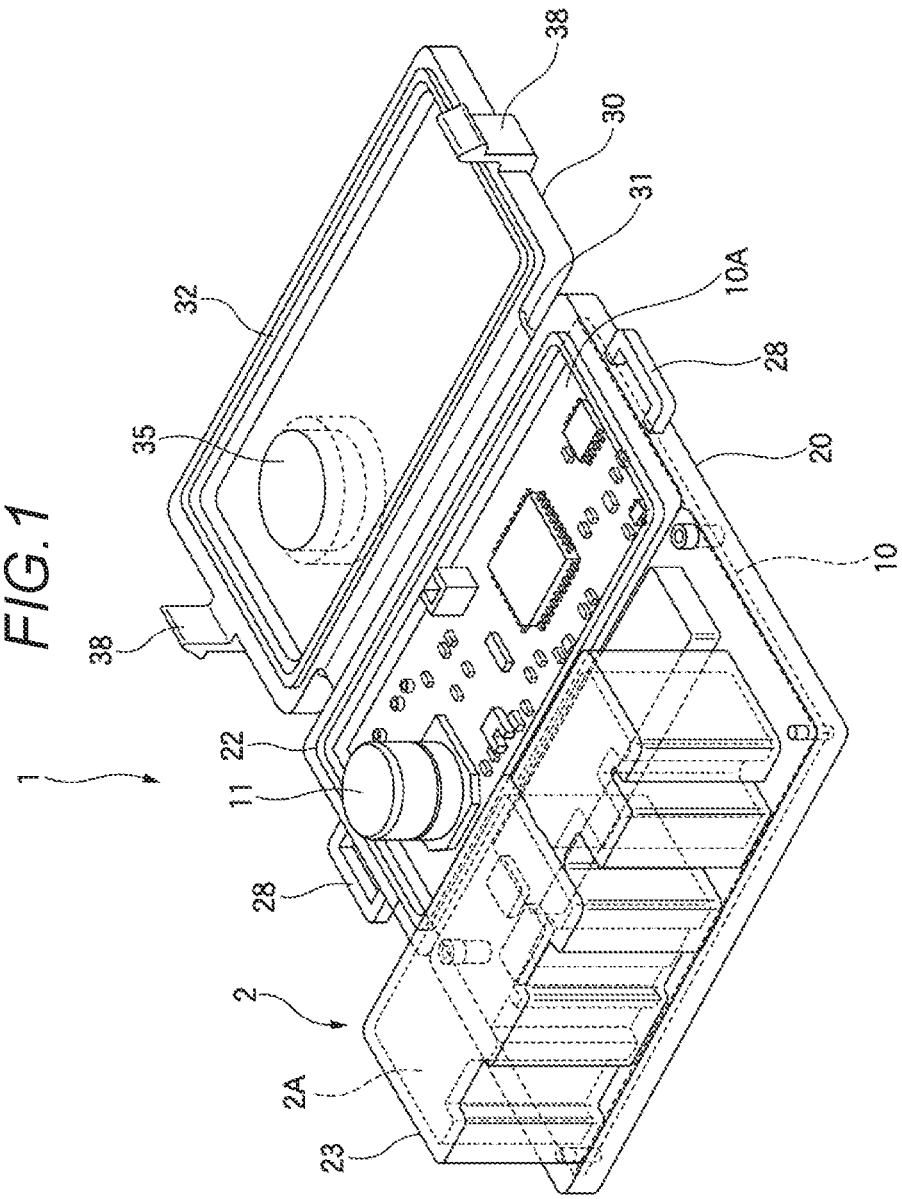
FIG. 1 is an external perspective view of an electronic circuit unit in which an outer case is formed by practicing a molding method according to an embodiment.
Figure 2A:
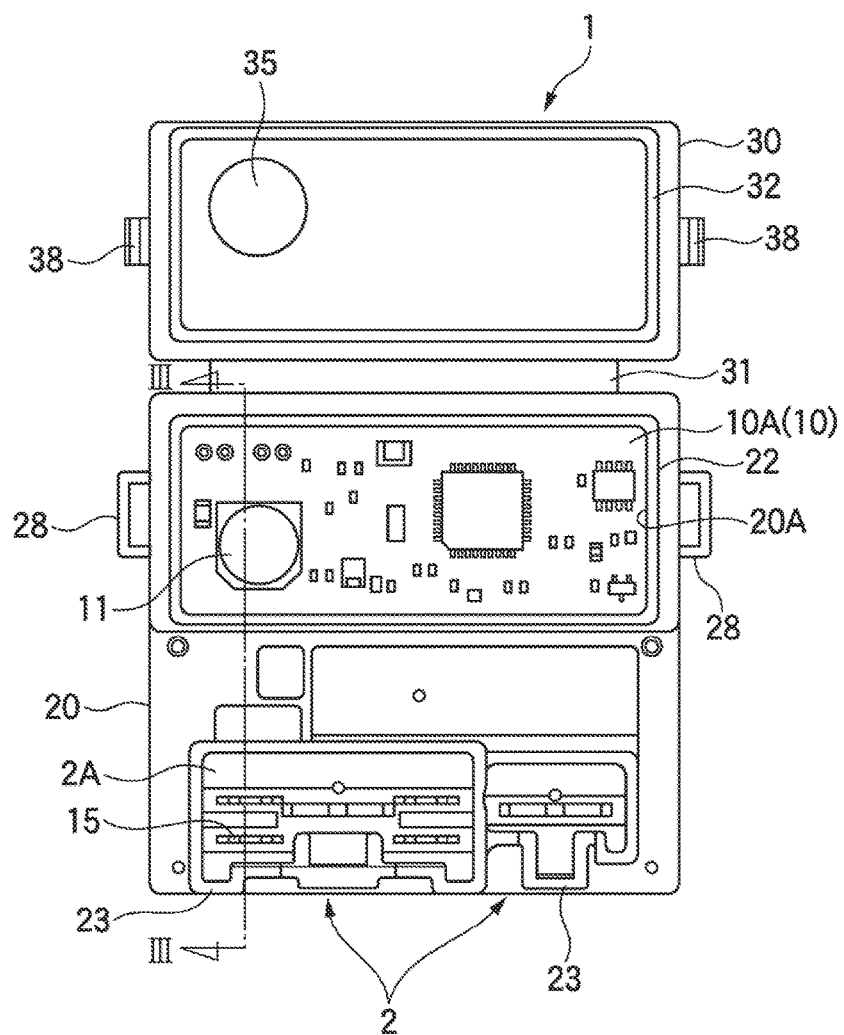
FIG. 2A is a top view illustrating configuration of the electronic circuit unit.
Figure 2B:
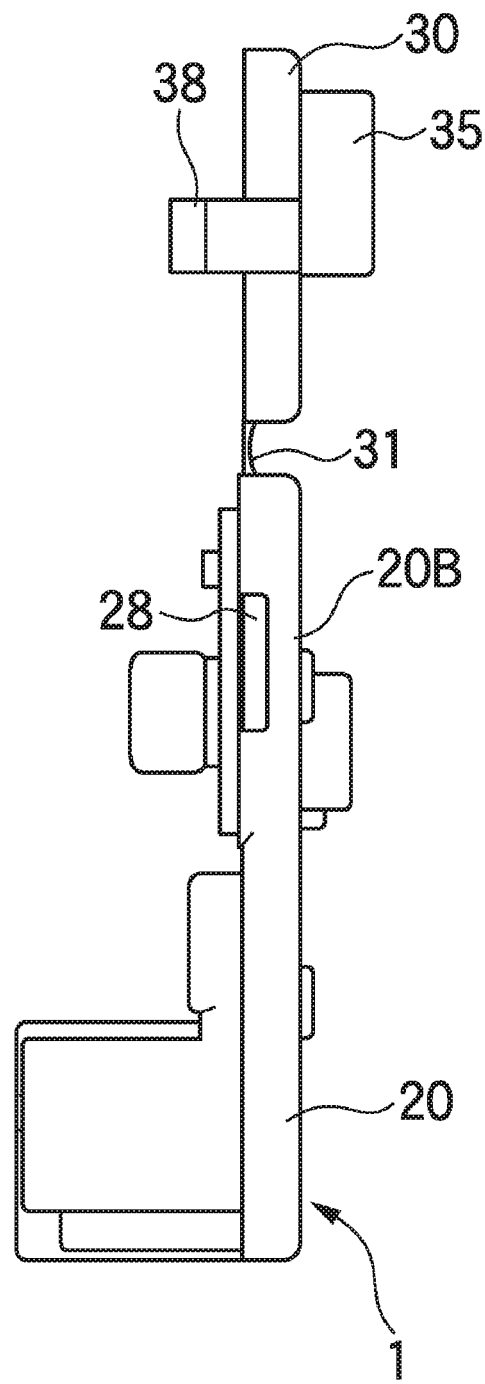
FIG. 2B is a side view illustrating the configuration of the electronic circuit unit.
Figure 2C:
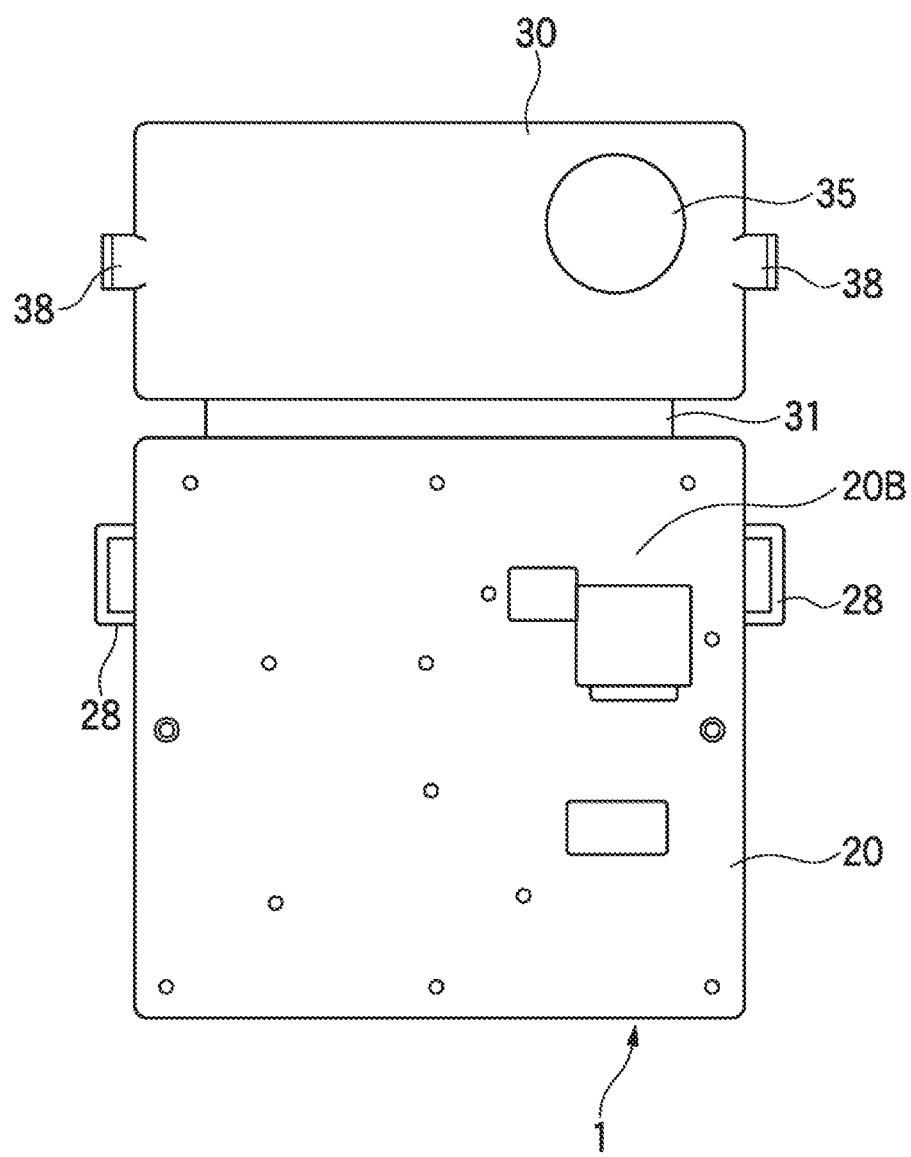
FIG. 2C is a bottom view illustrating the configuration of the electronic circuit unit.

FIG. 1 is an external perspective view of an electronic circuit unit in which an outer case is formed by practicing a molding method according to the embodiment. FIGS. 2A to 2C are configuration diagrams of the electronic circuit unit, wherein FIGS. 2A, 2B and 2C are a top view, a side view and a bottom view of the unit, respectively.

Firstly, the electronic circuit unit 1 as a preparation target will be explained prior to the explanation of the molding method.

As shown in FIGS. 1 to 2C, the electronic circuit unit 1 as the preparation target according to this embodiment is configured in a manner that a mold exclusion part 10A is provided at a part of a plate surface of a rectangular circuit board 10 which mounts electronic components 11 thereon and is covered in its entire periphery by an outer case 20 formed by mold resin. In the mold exclusion part, a rear surface side is covered by the mold resin, but a front surface side is not covered by the mold resin but exposed from the outer case 20.

A connector housing 23 constituting a connector 2 is integrally formed with the outer case 20 of the electronic circuit unit 1. The connector housing 23 is projected from a front surface side of the circuit board 10 in a direction perpendicular to the circuit board 10. Further, the outer case 20 is provided with a lid 30 which is positioned away from the connector 2 and is freely opening and closing via a thin hinge 31 so as to integrally cover the mold exclusion part 10A.

The mold exclusion part 10A of the circuit board 10 is a portion arranged at a part on the front surface side of the circuit board 10 where electronic components (for example, an electrolytic capacitor, an oscillator, a filter, etc.) 11 are arranged collectively. Each of these electronic components is intolerant of a pressure of the resin upon the molding, in other words, not preferable of being applied with the pressure at a time of forming the outer case 20 by injection molding. The mold exclusion part is disposed close to the lid 30. In a product stage, the mold exclusion part 10A is exposed outside from an opening 20A provided at the outer case 20. A circumferential edge of the opening 20A hangs over the front surface side of the circuit board 10 and is formed as a fitting frame 22 in which a convex frame 32 provided at an inner surface of the lid 30 fits.

The rear surface side of the mold exclusion part 10A is covered by the mold resin constituting a rear surface wall of the outer case 20. A part 20B (herein after also called "a rear surface wall of the mold exclusion part") on the rear surface wall of the outer case 20 located at the rear surface of the mold exclusion part 10A is constituted of thermoplastic resin like other portions constituting the rear surface wall.

As an example of the thermoplastic resin in this case, polybutylene terephthalate (PBT) as engineering plastic, which can exert high rigidity and heat-resistance as industrial products and is obtainable at a low cost, is used. Of course, other engineering plastic capable of exerting the similar performance may be used.

Engagement parts 28 are provided at suitable plural portions of the circumferential periphery of the opening 20A of the outer case 20, respectively. These engagement parts respectively engage with lock parts 38 of the lid 30 side when the opening 20A is closed by the lid 30 to lock the lid 30 at a closed position. Further, for example, in a case where an electronic component 11 of a large height is to be mounted on the circuit board 10, the lid 30 is provided with a component housing 35 which can house a head portion of the electronic component. By doing so, an entire mounting height of the lid 30 can be made low.

Figure 3:
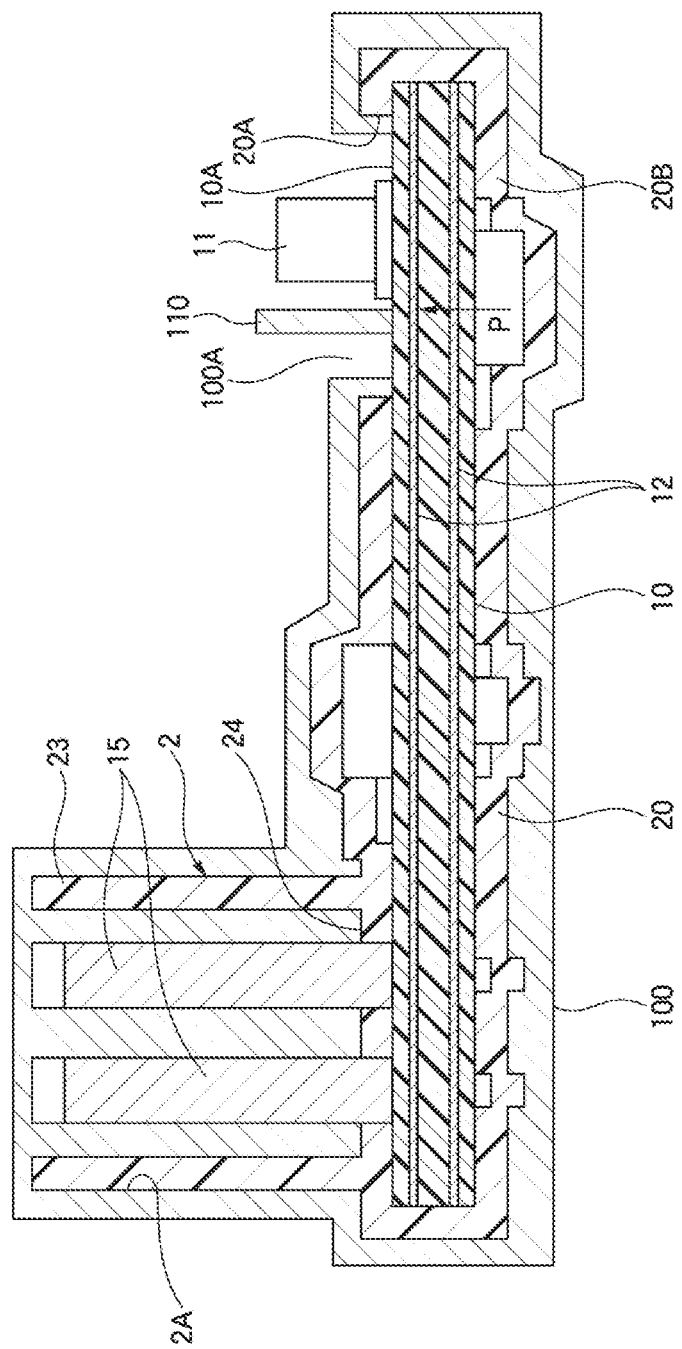
FIG. 3 is a diagram illustrating a relation among a die, the outer case and a circuit board in a case of performing insert molding according to the molding method of the embodiment, wherein this diagram is a sectional view of a portion corresponding to a section taken along line in FIG. 2A.

FIG. 3 is a diagram showing a relation among a die, the outer case and the circuit board in a case of performing the insert molding according to the molding method of the embodiment. This drawing is a sectional view of a portion corresponding to a section taken along line III-III in FIG. 2A.

As shown in FIG. 3, plural layers (although two layers are schematically shown in FIG. 3, the number of the layers is optional) of conductor wring patterns 12 formed by copper foil are provided in an inner layer of the circuit board 10 (also containing a front surface layer of the board, if required). Respective terminals of the electronic components (one of them is shown by the symbol 11) mounted on the front and rear surface sides of the circuit board 10 are electrically connected to the predetermined conductor wring patterns 12.

Further, at predetermined portions of the circuit board 10, respective base ends of connector terminals 15 extending to a direction crossing the circuit board 10 (to the front surface side of the circuit board 10) are connected to the predetermined conductor wring patterns 12. In this case, for example, a press-fit terminal, easily connectable to the conductor wring pattern 12 by being pressed into the circuit board 10, is used as each of the connector terminal 15.

In a case of molding the outer case 20 of the electronic circuit unit 1, the connector terminals 15 are attached to the predetermined portions of the circuit board 10 in advance and then the circuit board 10 is set within a die 100. At this time, the mold exclusion part 10A is exposed outside (or in a non-cavity space which secures a space not filled with the resin even within the die 100) from an opening 100A of the die 100. Then, molten resin is filled into a cavity (a space in which the resin constituting the outer case 20 is filled in FIG. 3) within the die 100 to form the outer case 20.

As the rear surface side of the mold exclusion part 10A is intended to be covered by the resin, the molten resin is also filled into a cavity constituting this portion (the rear surface wall 20B of the mold exclusion part). However, the molten resin is not filled on the front surface side of the mold exclusion part 10A.

Thus, due to unbalance of a force between the front and rear surface sides of the circuit board 10, at the time of filling the molten resin, a force P directed toward the front surface side from the rear surface side acts on the circuit board 10 of the mold exclusion part 10A due to a pressure of the resin. If this force P acts excessively, the circuit board 10 is deformed and thus the conductor wring patterns 12 at the inner layer of the circuit board 10 may be damaged.

In terms of this, according to the molding method of the embodiment, at the time of the injection molding (in particular, at the time of filling the molten resin), at least a part of the surface of the circuit board 10 of the mold exclusion part 10A facing the outside of the die 100 is pressed by a press member 110 toward the rear surface side. By doing so, the injection molding is performed while suppressing the deformation of the circuit board 10 due to the pressure of the resin upon the injection molding.

In this case, from a viewpoint of efficiency, the press member 110 preferably presses a portion of the circuit board 10 on the mold exclusion part 10A having a relatively low elastic modulus, in other words, a portion having a lower elastic modulus than other portion on the mold exclusion part 10A.

As shown in FIG. 4, the elastic modulus of the circuit board 10 is proportional to a residual ratio of the copper foil constituting the conductor wring patterns 12 (for example, a ratio of the portions where the copper foil is remained as the wring patterns by an etching process with respect to the entire area). Thus, it will be understood that an area not remaining the conductor wring pattern 12 or an area low in a density of the conductor wring pattern 12 (a portion having a narrow copper foil, a portion having a thin copper foil, etc.) is easily deformed. The press member 110 is pressed aiming against these areas. Alternatively, as the elastic modulus reduces as the temperature increases, the press member 110 is pressed aiming against an area where heat is likely confined upon the molding.

In this respect, as the die 100 is attached firmly to the circumferential periphery of the mold exclusion part 10A and applies a pressing force thereto, the press member 110 is pressed against a portion having a low elastic modulus in the center area of the mold exclusion part 10A. By doing so, the deformation of the circuit board 10 can be prevented effectively and the damage of the conductor wring patterns 12 can be avoided.

By molding in this manner, as shown in FIG. 1 to FIG. 2C, the electronic circuit unit 1 in the state of exposing the mold exclusion part 10A outside the outer case 20 can be formed.

Further, the connector 2 is configured by surrounding the circumferential peripheries of the connector terminals 15 with the cylindrical connector housing 23. In this case, as shown in FIG. 3, an inner wall 24 for fixing the base ends of the connector terminals 15 thereto is formed at an inner portion of a fitting space 2A for a counterpart connector secured within the cylindrical connector housing 23. By doing so, even in a case where the press-fit terminals are used as the connector terminals 15, the connector terminals 15 can be firmly held and fixed. Thus, even if a prying force acts on the connector terminals 15 at a time of fitting the counterpart connector, the connector terminals can exerts high durability.

As described above, according to the molding method of the embodiment, at the time of the injection molding of the outer case 20, at least a part of the surface of the circuit board 10 on the mold exclusion part 10A is pressed by the press member 110 toward the rear surface side. Thus, as the deformation of the circuit board 10 due to the pressure of the resin upon the injection molding can be suppressed, damage of each of the circuit board 10 and the electronic components 11 can be suppressed.

In particular, the press member 110 presses a portion on the mold exclusion part 10A having the low elastic modulus, that is, an easily deformable portion. Thus, damage of each of the circuit board 10 and the electronic components 11 can be suppressed efficiently.

Further, according to the molding method of the embodiment, as the connector housing 23 is integrally molded with the outer case 20, the connector is not required to be assembled independently.

Further, as the lid 30 covering the mold exclusion part 10A is molded integrally with the outer case 20 via the hinge 31, the lid 30 can protect the mold exclusion part 10A without increasing the number of the components.

Incidentally, the invention is not limited to the embodiment described above and can be suitably modified and improved, for example. In addition, the material, shape, size, number, arrangement position, etc. of each of the constituent elements in the aforesaid embodiment are not particularly limited and may be set optionally so long as the invention can be achieved.

For example, although description is not made in the embodiment as to in what way the press member 110 is provided, the press member 110 may be provided integrally with the die 100. In this case, as the mold exclusion part 10A is faced on the non-cavity space (the space securing the condition of not being filled with the resin even within the die) provided at the die 100, the press member 110 may be projected from a wall of the non-cavity space, for example.

In a case where the press member 110 is provided at the die 100 in this manner, deformation of the circuit board 10 upon the injection molding can be suppressed automatically by closing the die 100.

Further, although the number of the press member 110 is not described in the embodiment, a plurality of the press members 110 may be provided so that the respective press members 110 press plural portions of the mold exclusion part 10A.

Further, the press member may press an empty portion (an area where none of the electronic components, etc. are mounted and no member obstructing the pressing exists) of the mold exclusion part 10A over a large range.

Herein the features of the embodiments of a molding method for an outer case in an electronic circuit unit according to the invention will be briefly summarized and listed below in (1) to (5).

(1) A molding method for an outer case in an electronic circuit unit in which a mold exclusion part (10A), having a rear surface side covered by mold resin and a front surface side exposed from an outer case, is provided at a part of a plate surface of a circuit board (10) which is mounted with electronic components (11) and is covered by the outer case (20) formed by the mold resin, the molding method comprising:

setting the circuit board in a die (100); and injection molding of the outer case by filling molten resin into a cavity in the die, in pressing at least a part of a front surface side of the mold exclusion part facing a non-cavity space by press member (110) toward a rear surface side.

(2) The molding method for the outer case in the electronic circuit unit described in the feature (1), wherein the injection molding is performed in pressing a portion having a relatively low elastic modulus on the mold exclusion part in the circuit board by the press member.

(3) The molding method for the outer case in the electronic circuit unit described in the feature (1), wherein the pressing member is provided at the die.

(4) The molding method for the outer case in the electronic circuit unit described in any one of the features (1) to (3), wherein a connector housing (23) is integrally molded with the outer case.

(5) The molding method for the outer case in the electronic circuit unit described in any one of the features (1) to (4), wherein a lid (30) covering the mold exclusion part molded is integrally molded with the outer case via the hinge (31).

Although the invention is explained in detail with reference to the particular exemplary embodiment, it will be apparent for those skilled in the art that various changes and modifications are possible without departing from the spirit or range of the invention.

This invention is based on Japanese Patent Application (Japanese Patent Application No. 2013-269826) filed on Dec. 26, 2013, the content of which is incorporated herein by reference.

INDUSTRIAL APPLICABILITY

According to the invention, as the deformation of the circuit board due to the pressure of the resin upon the injection molding can be suppressed, damage of each of the circuit board and the electronic components can be suppressed. The invention achieving such the effect is usable for the outer case molding method in the electronic circuit unit in which the outer case formed by the mold resin is formed integrally with the circuit board.

REFERENCE SIGNS LIST 1 electronic circuit unit
10 circuit board
10A mold exclusion part
11 electronic component
20 outer case
20B rear surface side portion of mold exclusion part
23 connector housing
30 lid
31 hinge
100 die
110 press member

What is claimed is:

1. A molding method for an outer case in an electronic circuit unit in which a mold exclusion part, having a rear surface side covered by mold resin and a front surface side exposed from an outer case, is provided at a part of a plate surface of a circuit board which is mounted with electronic components and is covered by the outer case formed by the mold resin, the molding method comprising:

setting the circuit board in a die defining a cavity such that the front surface side of the mold exclusion part is exposed outside from an opening of the die at a non-cavity open space which secures a space not to be filled with the mold resin; and injection molding of the outer case by filling molten resin into the cavity in the die, in pressing at least a part of the front surface side of the mold exclusion part facing the non-cavity space by a press member toward a rear surface side, wherein at a time of filling the molten resin, the part of the front surface side of the mold exclusion part is pressed by the press member.

2. The molding method for the outer case in the electronic circuit unit according to claim 1, wherein the injection molding is performed in pressing a portion having a relatively low elastic modulus on the mold exclusion part in the circuit board by the press member.

3. The molding method for the outer case in the electronic circuit unit according to claim 1, wherein the pressing member is provided at the die.

4. The molding method for the outer case in the electronic circuit unit according to claim 1, wherein a connector housing is integrally molded with the outer case.

5. The molding method for the outer case in the electronic circuit unit according to claim 1, wherein a lid covering the mold exclusion part molded is integrally molded with the outer case via a hinge.

* * * * *